United States Patent
Akamine et al.

(10) Patent No.: US 7,683,723 B2
(45) Date of Patent: *Mar. 23, 2010

(54) PHASE LOCKED LOOP CIRCUITS, OFFSET PLL TRANSMITTERS, RADIO FREQUENCY INTEGRATED CIRCUITS AND MOBILE PHONE SYSTEMS

(75) Inventors: Yukinori Akamine, Kokubunji (JP); Manabu Kawabe, Hachioji (JP); Satoshi Tanaka, Kokubunji (JP); Yasuo Shima, Ome (JP); Ryoichi Takano, Takasaki (JP)

(73) Assignee: Renesas Technology Corp., Tokyo (JP)

( * ) Notice: Subject to any disclaimer, the term of this patent is extended or adjusted under 35 U.S.C. 154(b) by 128 days.

This patent is subject to a terminal disclaimer.

(21) Appl. No.: 11/865,729

(22) Filed: Oct. 2, 2007

(65) Prior Publication Data
US 2008/0030281 A1 Feb. 7, 2008

Related U.S. Application Data

(63) Continuation of application No. 11/341,615, filed on Jan. 30, 2006, now Pat. No. 7,352,250.

(30) Foreign Application Priority Data

Mar. 29, 2005 (JP) ............................. 2005-094161
Nov. 10, 2005 (JP) ............................. 2005-326340

(51) Int. Cl.
*H03L 7/07* (2006.01)
*H03L 7/085* (2006.01)

(52) U.S. Cl. ............................. 331/16; 331/25; 331/23; 327/157; 375/298; 375/373

(58) Field of Classification Search .................. 331/16, 331/17, 18, 23, 25, 44, 175, 177 R; 327/156, 327/157; 375/298
See application file for complete search history.

(56) References Cited

U.S. PATENT DOCUMENTS 4,153,884 A 5/1979 Ikeguchi et al.

(Continued)

OTHER PUBLICATIONS

S.T. Lee et al., "A 1.5V 28mA Fully-Integrated Fast-Locking Quad-Band GSM-GPRS Transmitter with Digital Auto-Calibration in 130nm CMOS", ISSCC Dig. Tech. Papers, pp. 188-189 (Feb. 2004) and enlarged figures (10 pages).

(Continued)

*Primary Examiner*—Robert Pascal
*Assistant Examiner*—Ryan J. Johnson
(74) *Attorney, Agent, or Firm*—Miles & Stockbridge P.C.

(57) ABSTRACT

A PLL circuit equipped with a loop gain detecting circuit that can suppress the change of the loop gain. When detecting the loop gain, the frequency of the input signal to the second input (IN-2) of the phase detector is first changed, and the response corresponding to the change is detected by the output of the voltage locked oscillator. The detection is performed by connecting the output of the voltage locked oscillator with the counter and connecting the output of the counter with the integrator. The phase locked loop characteristics are optimized by performing feedback for the detection result on the value of the charge pump current.

12 Claims, 16 Drawing Sheets

U.S. PATENT DOCUMENTS

| | | | |
|---|---|---|---|
| 6,100,767 | A | 8/2000 | Sumi |
| 6,621,354 | B1 | 9/2003 | Kornblum et al. |
| 7,352,250 | B2 * | 4/2008 | Akamine et al. ............... 331/16 |
| 7,482,881 | B2 * | 1/2009 | Chien ........................... 331/16 |
| 2004/0077327 | A1 * | 4/2004 | Lim et al. .................... 455/318 |
| 2006/0139105 | A1 | 6/2006 | Maxim et al. |

OTHER PUBLICATIONS

D.R. McMahill and C.G. Sodini, "A.2-5-Mb/s GFSK 5.0-Mb/s 4-FSK Automatically Calibrated Sigma delta Frequency Synthesizer" IEEE Journal of Solid State Circuits, vol. 37, No. 1, pp. 18-26 (Jan. 2002).

Yukinori Akamine et al., "A Loop-Bandwidth Calibration System for Fractional-N Synthesizer and ΔΣPLL Transmitter" Session 17.4 IEEE ISSCC 2005, pp. 12-20 (Feb. 2005).

Bill Huff, "A Fully-Integrated Bluetooth Synthesizer Using Digital Pre-distortion for PLL-based GFSK Modulation" 2003 IEEE RFIC Symposium, pp. 173-176 (Jun. 2003).

* cited by examiner

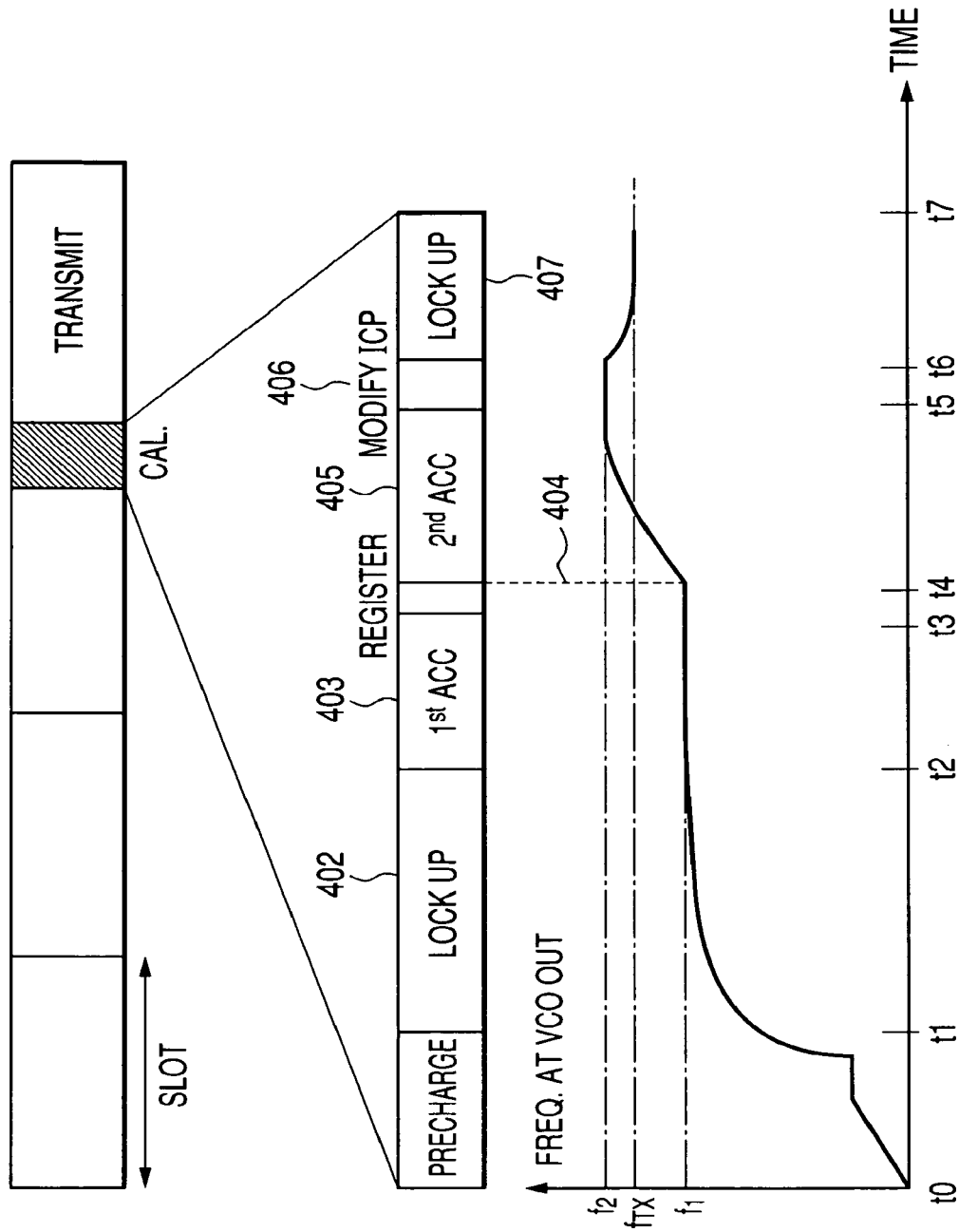

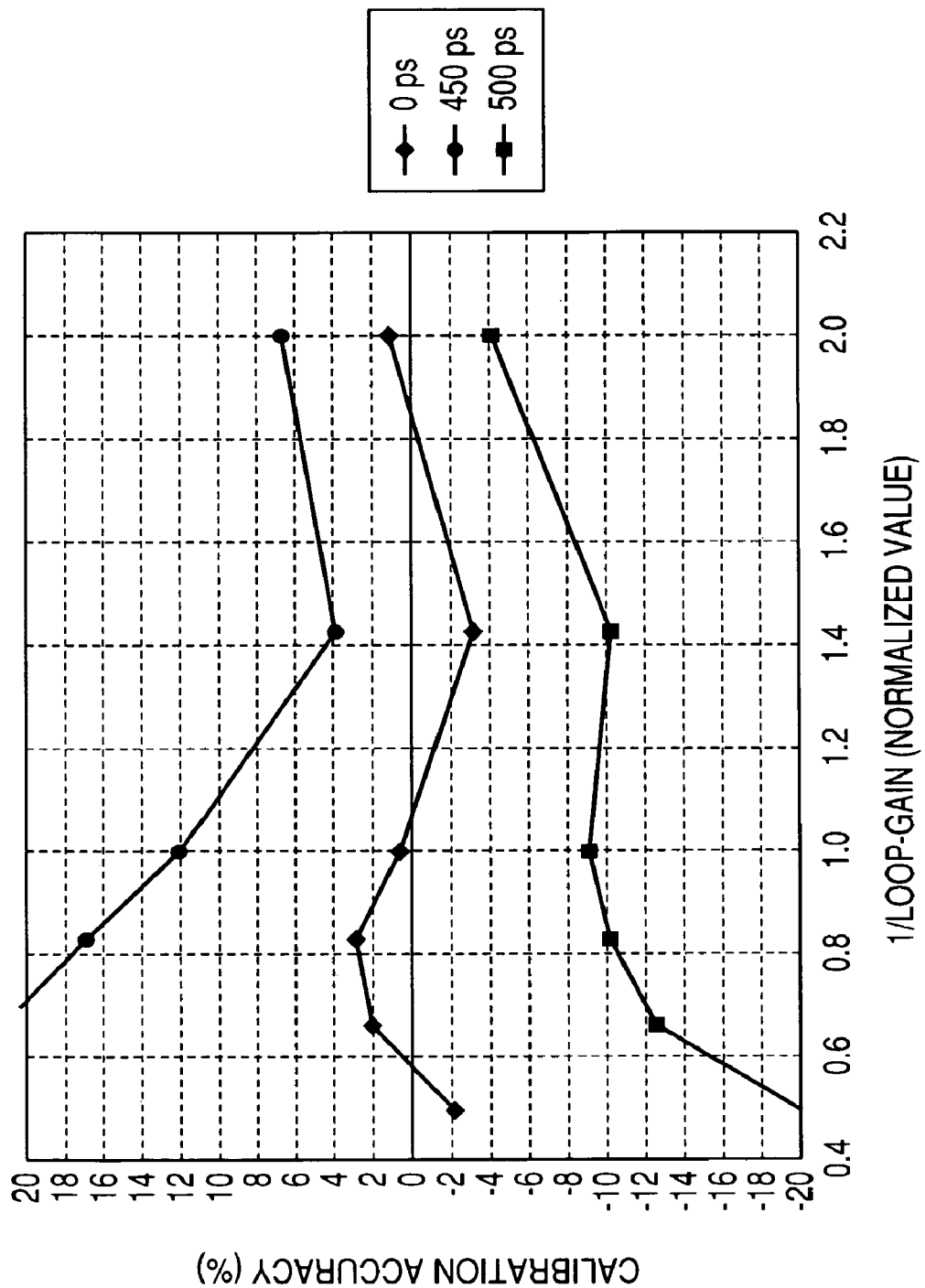

SIMULATION RESULT

SIMULATION RESULT

PHASE LOCKED LOOP CIRCUITS, OFFSET PLL TRANSMITTERS, RADIO FREQUENCY INTEGRATED CIRCUITS AND MOBILE PHONE SYSTEMS

CROSS-REFERENCE TO RELATED APPLICATION

This application is a continuation of application Ser. No. 11/341,615 filed Jan. 30, 2006, now U.S. Pat. No. 7,352,250 issued Apr. 1, 2008.

CLAIM OF PRIORITY

The present application claims priority from Japanese application JP 2005-094161 filed on Mar. 29, 2005 and Japanese application JP 2005-326340 filed on Nov. 10, 2005, the contents of which are hereby incorporated by reference into this application.

FIELD OF THE INVENTION

The present invention relates to a loop characteristics detecting circuit of a phase locked loop (PLL) circuit, more particularly to an offset PLL transmitter, radio frequency integrated circuit, and mobile phone system having a PLL circuit which is equipped with a loop gain detecting circuit based on the loop gain detecting method of a phase locked loop circuit and its detecting method.

BACKGROUND OF THE INVENTION

A transmitter circuit employing a PLL is described, for example, in non-patent documents 1 to 3. Each of them is a transmitter-receiver system, which calibrates a loop bandwidth with a fractional-N PLL.

Firstly, the transmitter-receiver system of non-patent document 1 inputs an 0101 pattern by the data signal from the base band as a signal for detecting the loop band-width, and inputs it into the fractional-N PLL. The loop band-width is detected by monitoring the output of a voltage controlled signal source.

In the transmitter-receiver system of non-patent document 2, the signal to detect the loop band-width utilizes the transmitting data signal. As for the detecting method, by monitoring the output of a voltage controlled signal source and digitizing the phase component, the signal is compared with the data signal from the base band, further integrated to detect the loop band-width.

The invention, according to non-patent document 3, is intended for the calibration system of the loop band-width in the fractional-N PLL. For the signal to detect the loop band-width, a step signal is input into the divider through a sigma delta modulator in the PLL. In this case, the feedback input signal has a phase transition in the phase detector.

On the other hand, in non-patent document 4, a transmitter-receiver system is disclosed which performs the calibration of the loop band-width in the Digital Frequency Locked Loop. In this case, the calibration of the loop band-width is conducted by using a charge pump type DA converter and loop filter, two different voltages being given to a voltage controlled power source, and detecting the gain in the voltage controlled power source by the frequency change therefrom.

Non-patent document 1: S. T. Lee et al., "A 1.5V 2.8 mA Fully-Integrated Fast-Locking Quad-Band GSM-GPRS Transmitter with Digital Auto-Calibration in 130 nm CMOS", IS SCC Dig. Tech. Papers, pp 188-189 (February 2004)

Non-patent document 2: D. R. McMahill and C. G. Sodini, "A 2.5-Mb/s GFSK 5.0-Mb/s 4-FSK Automatically Calibrated Sigma Delta Frequency Synthesizer" IEEE Journal of Solid State Circuit (January 2002)

Non-patent document 3: Yukinori Akamine et al., "A Loop Bandwidth Calibration System for Fractional-N System for Fractional-N Synthesizer and $\Delta\Sigma$PLL Transmitter" Session 17.4 ISSCC 2005 (February 2005)

Non-patent document 4: Bill Huff, "A fully-integrated Bluetooth synthesizer using digital pre-distortion for PLL-based GFSK modulation" 2003 IEEE RFIC symposium (June 2003)

SUMMARY OF THE INVENTION

A radio transmitter has a predetermined frequency for transmission and a certain degree of frequency accuracy is required so as not to have an adverse affect on devices using the adjacent frequency band. That is, since a number of cell phones and car phones utilize radio waves at the same time, each terminal is controlled not to interfere with each other by changing the frequency for use and performing time-sharing. For example, a cell phone, according to the GSM (Global System for Mobile Communications) standard, sets up a channel at 200 kHz intervals. Thus, it is required that the oscillating frequency of the VCO be set up at 200 kHz intervals; however, since the division ratio is an integer, the frequency of the VCO can only take the value, which is an integer multiple of the reference frequency, so that a fine frequency configuration cannot be performed. Therefore, it is necessary to finely change the division ratio in terms of time to create an intermediate pseudo-frequency. The process of changing the division ratio is called a sigma-delta modulation.

Since the frequency accuracy required for a cell phone and car phone is greater than that of the radio frequency oscillator, the PLL circuit is generally configured with a device having high frequency accuracy, such as a crystal oscillator, as a reference signal to enhance the frequency accuracy of the radio frequency oscillator. The PLL circuit compares the input signal with the signal from the oscillator included in the circuit, detects a time lag of the frequency and phase, performs feedback of the error to the oscillator and generates an output signal.

Conventionally, external parts were used for the loop filter circuit employed for the PLL circuit because, in addition to the number of elements such as resistance and capacitance being large, when integrated in the LSIs, the analog accuracy is lowered due to the variation of elements that cause deterioration of the calibration accuracy, the scale of the circuit becomes large, and it takes time to calibrate.

However, downsizing is always required for mobile communication equipment. The reduction of external parts is one of the serious problems in promoting the integration and downsizing of mobile communication equipment. Therefore, the development of a technique that allows the loop filter circuit to be integrated into the PLL circuit without causing deterioration of the calibration accuracy is required.

When housing the loop filter in the ICs as one part of measures to reduce external parts, the variation of the element becomes large and the deviation from the design value becomes remarkable. That is, the loop band-width of the phase locked loop sometimes largely deviates from the design value due to the sensitivity of the voltage locked oscillator and the variation of the elements comprising the loop filter.

When adopting a GMC-type filter, the effect of the variation can be reduced; however, the effect of the noise becomes large, which is an especially serious problem for a system with a strict requirement for the noise level. Accordingly, without adopting the GMC-type filter, a method to optimize a loop band-width with higher precision is required.

In addition, for the cell phone system of recent years, time allocated for each user is limited, making necessary a method for optimizing the loop band-width in a short time.

For the system disclosed in non-patent document 1, a special data signal source is required for preparation and its usage is limited to the fractional-N PLL. Further, the pre-emphasis part is optimized to calibrate the loop band-width; therefore, there remains the problem that the system can only be used for the PLL, which performs pre-emphasis, and that it takes time to calibrate the loop band-width.

Since usage is limited to the fractional-N PLL, the system disclosed in non-patent document 2 also takes a long time to calibrate the loop band-width.

The system disclosed in non-patent document 3 employs an improved method for facilitating the calibration of the loop band-width; however, it is based on the fractional-N PLL, so it cannot be used for general purposes.

Here, some supplementary explanations will be given for the fractional-N PLL. This method finely controls the oscillating frequency of the voltage-controlled oscillator (VCO) by employing the sigma-delta modulation, which changes the division ratio. However, since the sigma delta modulation is adopted to change the division ratio, there are the disadvantages that it is difficult to have a broader frequency range, and at the same time, the phase noise is so large that it is not suitable for a system requiring a strict noise level. Furthermore, since the VCO configuring the PLL has high sensitivity to load variation, it is not suitable for broader frequency ranges from this viewpoint. Thus, the systems disclosed in non-patent documents 1 to 3 cannot be applied to PLLs of various methods, as represented by the offset PLL transmitter.

On the other hand, the device disclosed in non-patent document 4 does not meet the requirement for integration and downsizing of mobile communication equipment because, as a circuit dedicated to calibrating the loop band-width, large-scale circuits are necessary, such as a loop filter and a D/A converter.

The purpose of the present invention is to provide a phase locked loop circuit, a semiconductor integrated circuit for communication, and a mobile phone system that are equipped with a calibration system capable of optimizing the loop band-width in various types of phase locked loops in a short time, and at the same time, with high precision.

The other purpose of the present invention is to provide a phase locked loop circuit and radio frequency integrated circuit that are equipped with a calibration system capable of setting up the loop band-width in various types of phase locked loops with a simple configuration, and, at the same time, in a short amount of time with high precision, achieving high integration and low power dissipation through the integration of the PLL circuit.

The other purpose of the present invention is to provide a phase locked loop circuit, a radio frequency integrated circuit, and a mobile phone system that are applicable to various types of PLLs, having a low phase noise and hardly being affected by load variation.

The other purpose of the present invention is to provide a radio frequency integrated circuit, which can set up the loop band-width in various types of phase locked loops with a simple configuration and high precision, achieving high integration and low power dissipation through the integration of the PLL circuit, and, at the same time, reduce noise and chip area.

An example of the typical means for the present invention will be shown as follows.

The phase locked loop circuit according to the present invention includes a first voltage locked oscillator, a first circuit for frequency conversion, with which the output of the first voltage locked oscillator is connected, a first phase detector, with whose first input, the output of the first circuit for frequency conversion is connected, and with whose second input, a first reference signal is connected, a first charge pump circuit, with which the output of the first phase detector is connected, and a first loop filter, with which the output of the first charge pump circuit is connected, in which the output of the first loop filter is configured to be connected with the input of the voltage locked oscillator, with the input of the second input of the first phase detector, the first reference signal and a first signal source for detecting the loop characteristics, whose frequency varies, are configured to be able to be selectively connected, and the first signal source has a configuration to compensate the delay caused in the process of generating the first reference signal.

According to the present invention, since the charge pump current can be changed through the result of the measurement of the loop gain of the PLL circuit, a calibration system can be provided which can configure an optimal loop band-width in a short amount of time and with high precision. In addition, the present invention has the advantage that it is applicable not only to the fractional-N PLL but also to various types of PLLs.

BRIEF DESCRIPTION OF THE DRAWINGS

FIG. 4B is a diagram showing the time chart of the loop characteristics detecting process and its corresponding frequency characteristics of the voltage locked oscillator (VCO) 201;

FIG. 9B is a diagram showing the relation between the reciprocal of the loop gain and the accuracy, with which the loop band-width can be detected;

DETAILED DESCRIPTION OF THE PREFERRED EMBODIMENTS

Figure 1:
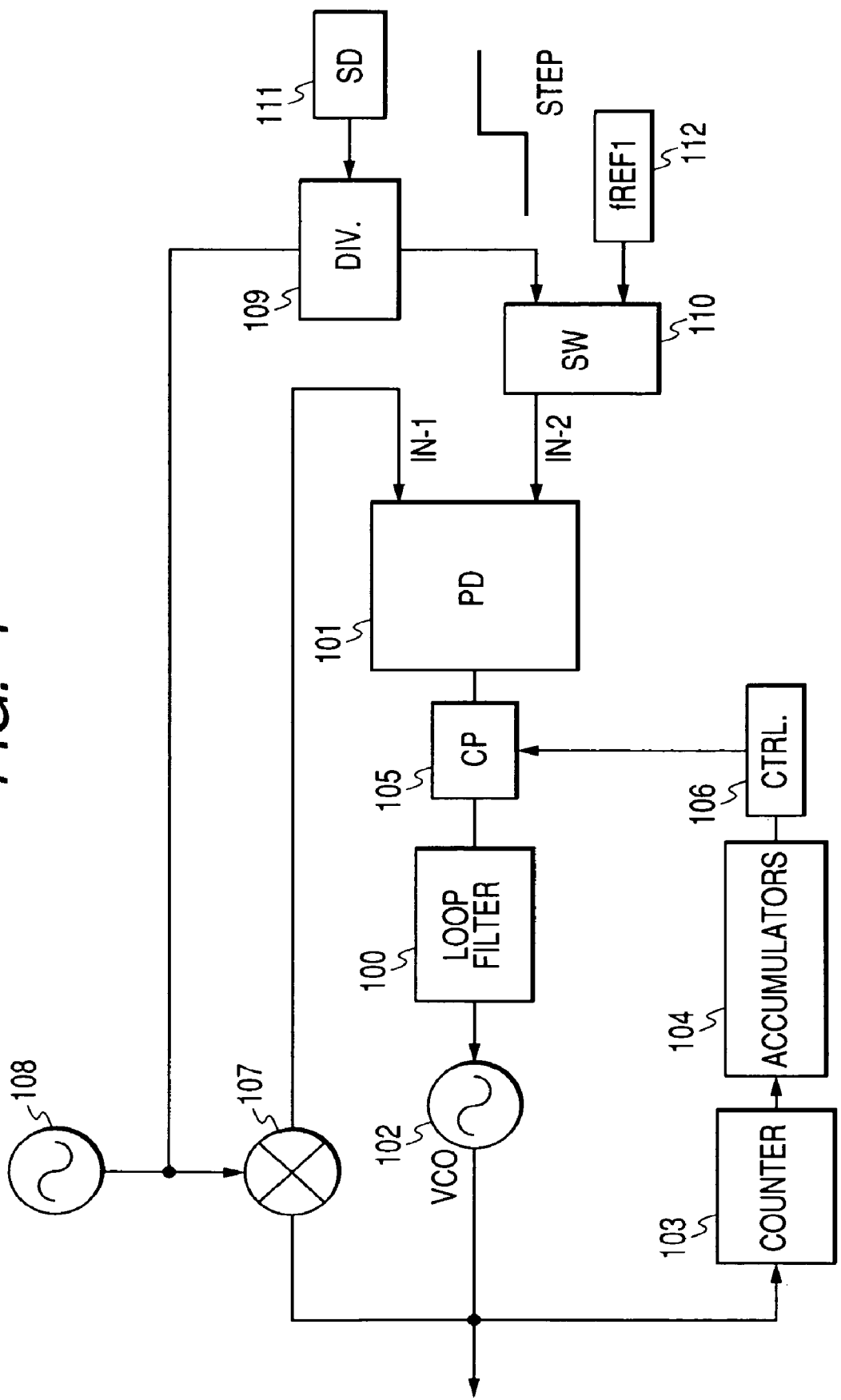
FIG. 1 is a block diagram illustrating the basic configuration of the PLL circuit as an embodiment of the present invention.

While referring to the attached drawings, a detailed description of the embodiment of the present invention will be given. FIG. 1 is a block diagram illustrating a basic configuration of a PLL circuit, as an embodiment of the present invention, having a loop gain detecting circuit, which can suppress the variation of the loop gain.

In FIG. 1, the phase locked loop (PLL) circuit is provided with first loop filter 100, first voltage locked oscillator 102, with whose frequency control terminal the output of the first loop filter is connected, first circuit for frequency conversion (DCM) 107, with which the output of the first voltage locked oscillator is connected, first phase detector (PD) 101, and first charge pump circuit (CP) 105, which is connected between the output of first phase detector 101 and the input of first loop filter 100.

First phase detector 101 is provided with a first input (IN-1), with which the output of first circuit 107 for frequency conversion is connected, and a second input (IN-2), with which first reference signal (fREF1) 112 is connected.

Further, the second input (IN-2) of first phase detector 101 can connect with a step signal (a second reference signal) via changeover switch 107, which is independent of the first reference signal.

First reference signal 112, connected with the second input (IN-2), is a transmitting signal generated by utilizing the output signal of synthesizer (radio frequency oscillator) 108, for example.

The second reference signal is a step signal for detecting loop characteristics, which is supplied by first signal source 109, based on the output signal of synthesizer 108, and whose frequency is modulated by sigma delta modulation circuit 111, for example.

Further, first signal source 109, which generates the second reference signal, has a configuration to compensate for the delay caused in the process of generating the first reference signal (fREF1).

In the PLL circuit, when detecting loop characteristics, the frequency of the input signal to the second input (IN-2) of phase detector 101, which is supplied from first signal source 108, is changed stepwise to detect the response corresponding to the change by the output of voltage locked oscillator 102.

The detecting method is realized by connecting the output of counter 103, which is connected with the output of voltage locked oscillator 102, with integrator 104, for example.

In the operating part of controller 220, based on the result of the detection by integrator 104, the value of the charge pump current is calculated to perform feedback for charge pump 105.

When the voltage-control sensitivity of the oscillating frequency of the VCO is Kv, the driving current of charge pump 105 being Icp, and the capacitance being C, these values and the loop gain have the following relation.

Loop gain ∝ (Icp·Kv)/C

By optimizing the charge pump current Icp using the above relation, the loop band-width can be calibrated to optimize the phase locked loop characteristics of the PLL circuit.

In the present embodiment, especially by configuring first signal source 109, which generates the second reference signal, to set up the frequency generated by sigma delta modulation circuit 111 to be a fractional frequency (the small division ratio against the frequency of RFVCO), variations caused by the delay factor can be reduced.

In the present embodiment, a signal for detecting the loop band-width is directly input in the reference signal input side (IN-2) of phase detector 101.

As a result, it is applicable to various types of PLLs, represented by the offset PLL transmitter, which allows the charge pump current to change.

Further, there is the advantage of the present embodiment that the time necessary for calibrating the loop band-width is short.

Furthermore, the signal, which was originally meant for local use, is frequency-divided by using the divider to be input to the reference signal side (IN-2) of the phase detector, so that the local signal can be effectively used.

The calibration circuit according to the present embodiment can configure all of counter 103, integrator 104, etc., by digital circuits, which are necessary for the detection of the step response, so that it is possible for these to be integrated into the PLL circuit.

In addition, a phase locked loop circuit that has low phase noise and that can not be easily affected by load variation can be achieved.

Further, the analog characteristics of the PLL circuit are determined by the amount of error feedback, sensitivity in controlling the oscillator, characteristics of the loop filter, etc. According to the calibration circuit of the present embodiment, it is possible to collectively calibrate all of the variation in performance with high precision.

Thus, the entire loop filter circuit is integrated into the PLL circuit to realize the downsizing and high performance of the radio frequency analog LSI.

In addition, by connecting multiple stages of integrators at the output of integrator 104, the accuracy of the detection can be enhanced.

While referring to the attached drawings, more concrete embodiments of the present invention will be described as follows.

First Embodiment

The first embodiment according to the present invention will be illustrated by using FIGS. 2 to 7. The present embodiment is such that a step waveform is input into the offset PLL-type phase locked loop circuit to detect the response by the output of voltage locked oscillator 201.

Figure 2:
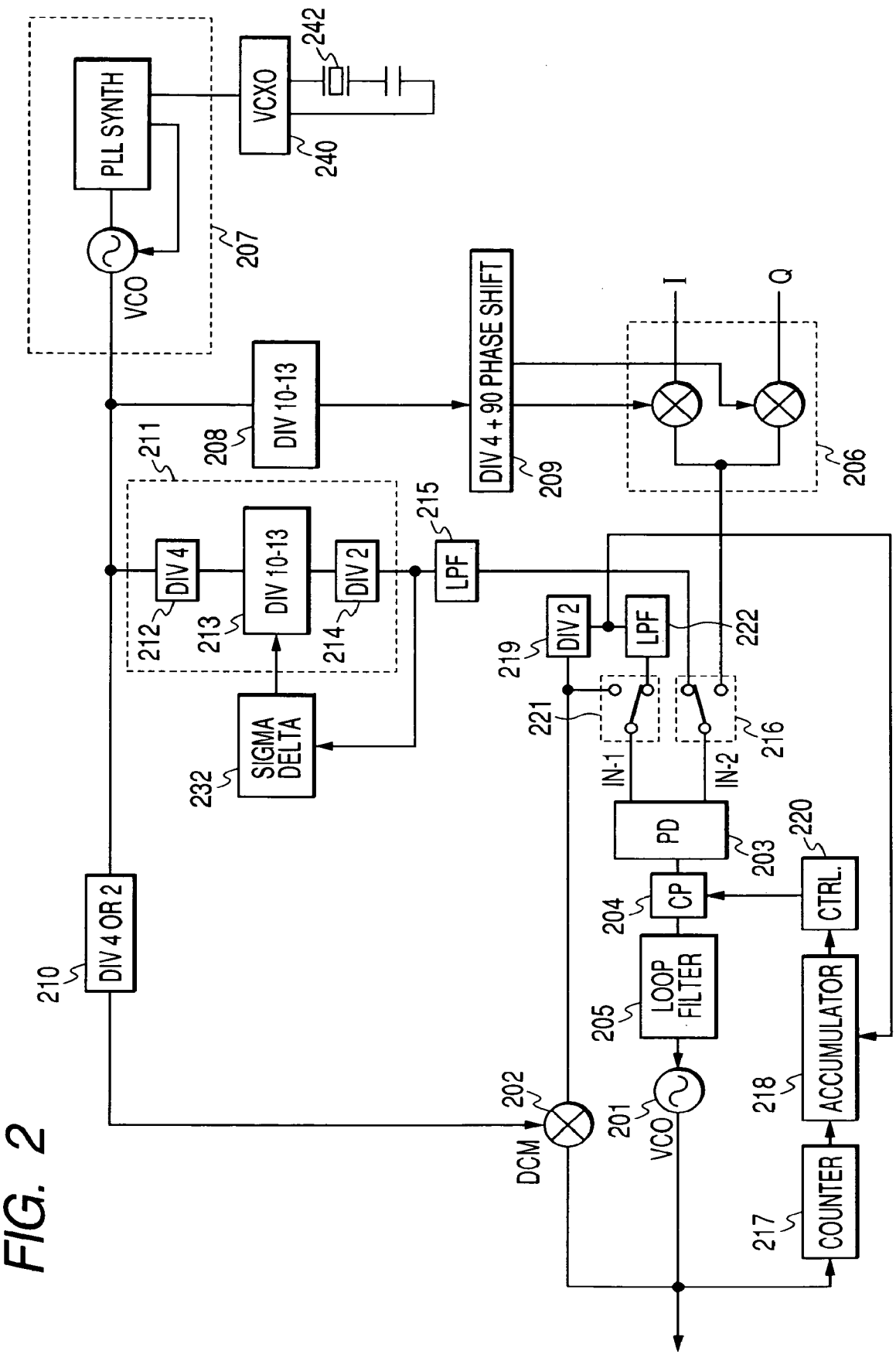
FIG. 2 is a diagram showing the entire configuration of the offset PLL phase locked loop circuit and offset PLL transmitter, including the above, according to the first embodiment of the present invention.

Firstly, in FIG. 2, the entire configuration and operation of the offset PLL-type phase locked loop circuit and the offset PLL transmitter, including the above, will be illustrated. Firstly, the configuration of the offset PLL and its theory of operation will be briefly described. The offset PLL-type phase locked loop circuit is composed of voltage locked oscillator (VOC) 201, down conversion mixer (DCM) 202, phase detector (PD) 203, charge pump (CP) 204, and loop filter (LF) 205.

In the first input (IN-1) of phase detector 203 of the PLL circuit, the output of VCO 201, is input through switch 221. The output of VCO 201 is compared with the first reference signal (fREF1), which was input into the second input (IN-2) of phase detector 203 through switch 216, and the pulse width is determined based on the phase error obtained from the result of the comparison. Then, the current with this pulse width is output by charge pump 204, and, after being integrated by loop filter 205, is returned to the frequency control terminal of VCO 201. Thus, the PLL circuit converges to a state in which the phase error between the first input (IN-1) and second input (IN-2) of phase detector 203 becomes the minimum.

In the phase locked loop circuit, at the transmitting mode, by inputting the transmitting signal (fREF1) from I/Q modulator 206 into the second input (IN-2) of phase detector 203 as a reference signal, a modulation signal is generated at the output of voltage locked oscillator 201. When employing fractional-type synthesizer 207, it is possible to create the local signal input into I/Q modulator 206 and the local signal input into down conversion mixer (DCM) 202 in the synthesizer 207. In this case, as an example, as for the local signal to I/Q modulator 206, a signal is employed wherein the output signal of synthesizer 207 is frequency-divided under values from 10 to 13, using divider 208, and is further put through 90-degree shifter 209. Then, for the local signal to down conversion mixer (DCM) 202, a signal is employed, which is obtained through frequency-dividing the output signal of synthesizer 207 into two or four by divider 210.

In addition, in order to generate the clock signal of the reference signal of synthesizer 207, voltage controlled crystal oscillator (VCXO) 240 is provided. Voltage controlled crystal oscillator 240 generates a reference signal to keep in step with crystal oscillator 242.

Next, the device and method for generating the step waveform used for detecting the loop characteristics will be explained. Firstly, the device for generating the step waveform is composed of divider 211 for frequency-dividing the output signal of synthesizer 207 and sigma delta modulation circuit 232 for controlling the division number. Divider 211 has dividers 212, 213 and 214, and its output signal is sent to the second input (IN-2) of phase detector 203 through low pass filter 215 and switch 216.

Divider 211, at first, frequency-divides the output signal of synthesizer 207 into four by divider 212, the output being frequency-divided by divider 213 into 10 to 13. The 10 to 13 dividers are controlled by the sigma delta modulator to perform a fractional operation. The output is frequency-divided by divider 214 into two. The configuration of divider 211 is not limited to this example.

In addition, if the output signal of divider 214 from divider 211 is used as the clock signal of sigma delta modulator 232, it is convenient that divider 211 and sigma delta modulator 232 be synchronized.

With switch 221, which is located at the first input (IN-1) side of phase detector 203, the first path, to which the output of the down conversion mixer (DCM) is directly supplied, and the second path, which runs by way of ½ frequency divider 219, and low pass filter 222, are connected. Switch 221 is switched in accordance with the operational condition of the phase locked loop circuit that is the normal mode or the loop characteristics detecting mode.

Switch 216, which is located at the second input (IN-2) of phase detector 203, also operates in accordance with the operational condition of the phase locked loop circuit, which is the normal mode or loop characteristics detecting mode, choosing either the transmitting signal from I/Q modulator 206 or the loop characteristics detecting signal from low pass filter 215.

Next, explanations will be given for the step signal for detecting the loop characteristics. The output signal of divider 211 is input into the second input (IN-2) of phase detector 203 via switch 216 after the waveform has been arranged by low pass filter 215. In the loop characteristics detecting mode, switch 216 selects the loop characteristics detecting signal on the low pass filter 215 side.

Then, in input switch 221, corresponding to the first input (IN-1) of phase detector 203, the second pass is employed, which runs byway of ½ frequency divider 219. This is because, in the loop characteristics detecting mode, in order to suppress the operating clock of sigma delta modulator 232, a ½ frequency of the normal mode is used for the input signal of phase detector 203.

With regard to the step signal for detecting the loop characteristics, it is conducted by changing the number of divisions of divider 211 by sigma delta modulator 232. By employing the sigma delta modulator, it is possible to easily generate any small frequency step signal suitable for detecting loop characteristics.

Next, explanations will be given for the configuration for compensating for the delay caused in the process of generating the first reference signal, that is, the transmitting signal (fREF1) from I/Q modulator 206 in the loop characteristics detecting mode. In the phase locked loop circuit according to the present embodiment, with regard to the step signal in the offset PLL for detecting the loop characteristics, it is conducted by changing the number of divisions of divider 211 by sigma delta modulator 232. In this case, the division ratio of divider 211 is stepped from a fractional value to a fractional value. That is, in the present embodiment, by controlling divider 211 so as to step from a fractional value to a fractional value in the loop characteristics detecting mode, the delay caused in the process of generating the first reference signal (fREF1).

Next, the detector of loop characteristics will be illustrated. As for the detector of loop characteristics, counter 217 is provided with the output of voltage locked oscillator 201, and integrator 218 is connected with its output. Regarding the clock for sampling the count value of counter 217, it is possible to obtain stable accuracy by employing the signal, which is obtained by frequency-dividing the output of down conversion mixer 202 into two by divider 219. The result of the detection is reflected so that the value of charge pump current 204 should be optimal through a simple calculation by a linear approximation in the operation part of controller 220. The controller will later be described in detail.

Figure 3:
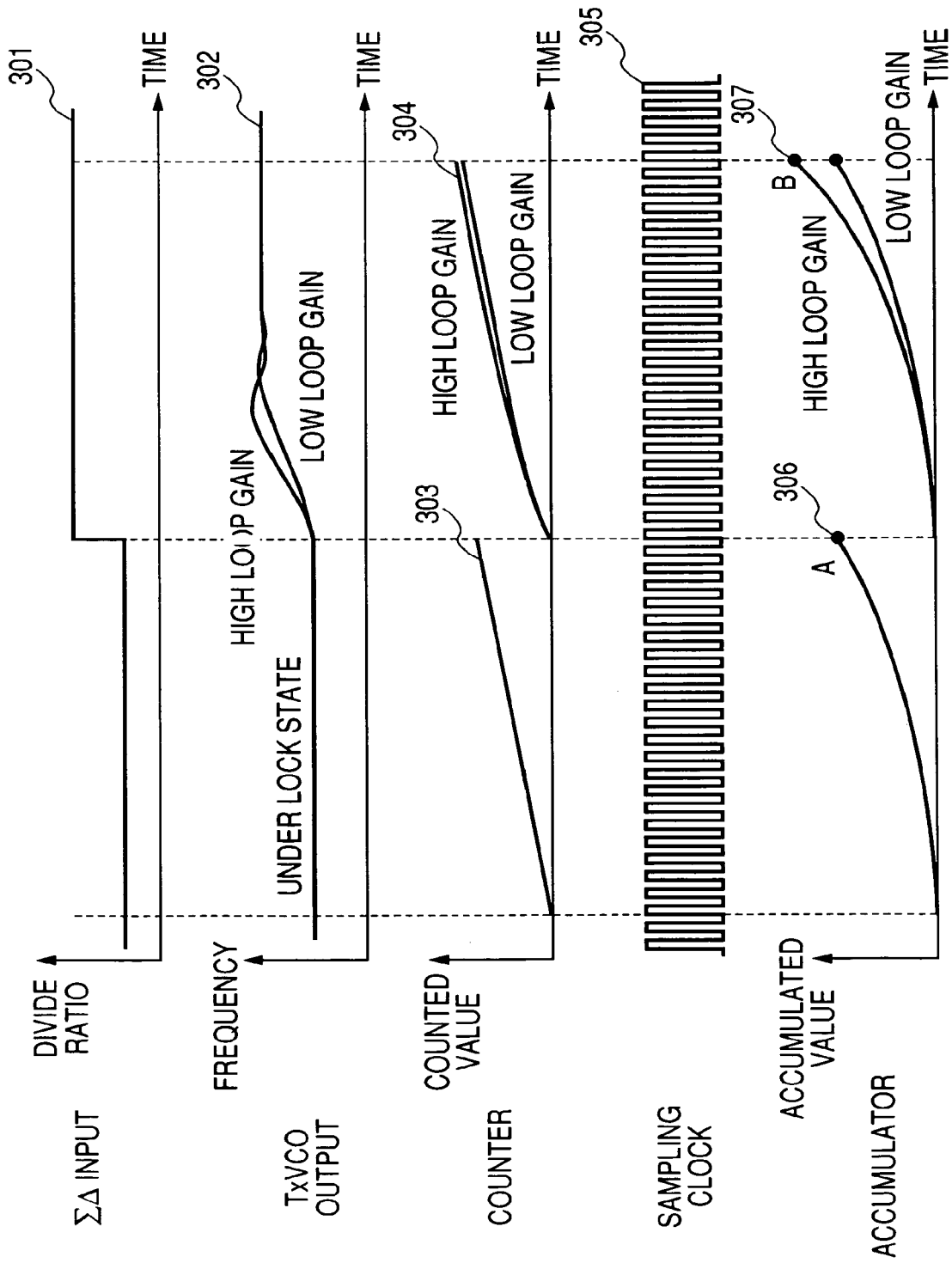
FIG. 3 is a diagram showing the transient waveform of each part in FIG. 2.
Figure 4A:
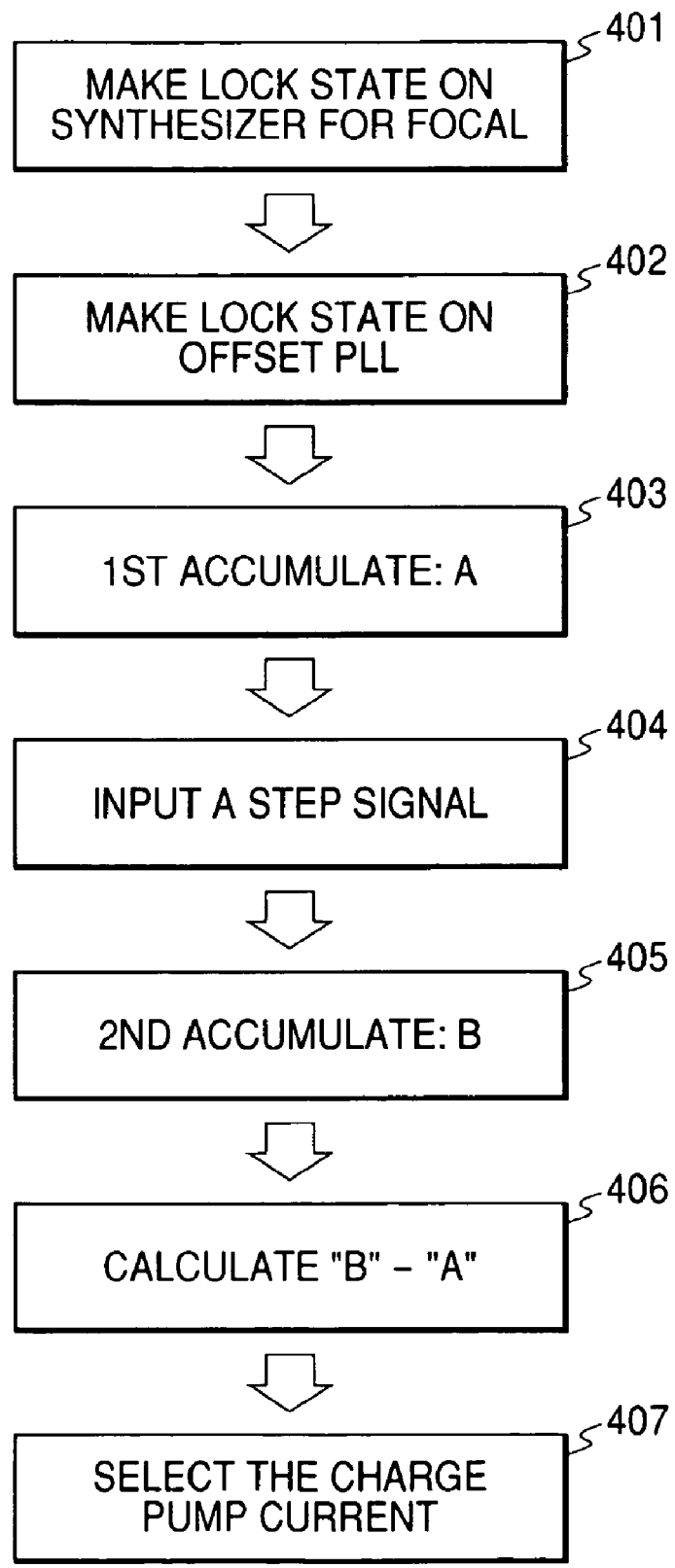
FIG. 4A is a diagram showing a flow chart of the loop characteristics detecting process according to the first embodiment.

Next, the sequence for detecting the loop characteristics of the phase locked loop circuit will be illustrated by using FIGS. 3 and 4 (FIGS. 4A and 4B).

Firstly, the operating waveform in each part of the system of FIG. 2 is described in FIG. 3.

Waveform 301 is a step signal input into sigma delta modulator 232. For example, when an eleven frequency-division is required for use under normal operation, the fractional step signal around the eleven frequency-divisions is input, such as from a 10.9 division to an 11.1 division. Waveform 302 shows conditions of frequency changes at the output of voltage controlled power source 201. When the step signal of waveform 301 is input into phase detector 203 with the offset PLL being locked, as shown in waveform 302, when the loop gain is higher than a proper value, the frequency rapidly changes in the output of voltage controlled power source 201, and when the loop gain is lower than the proper value, the frequency slowly changes.

Waveform 303 shows conditions of the output of counter 217 under the condition that the offset PLL is locked. Waveform 304 shows conditions of the output of the counter at the step response, and at the moment the step waveform is input, the count value re-starts from zero. There is a difference in the count value between the case when the loop gain is higher than the appropriate value and the case when it is lower; however, the difference is small.

Waveform 305 is a clock for sampling the count value, and, in this case, the output signal of divider 219 is employed. The count value sampled by this clock is integrated by integrator 218 in the latter stage. Waveform 306 is the integrated value of integrator 218, showing a change under the condition that the offset PLL is locked. Waveform 307 is also an integrated value of integrator 218, showing a change in the integrated value in the step response. In the case that the loop gain is high, the integration value is different from the case that it is small, and the difference is larger than the difference on counter 217. That is, by performing integration, the difference can be precisely detected.

The difference (B−A) between terminal B of waveform 307 and terminal A of waveform 306 varies in an almost proportional relationship with the inverse of the loop gain (1/Loop-gain) This proportional relation is utilized in the calculation of controller 220.

Next, by using FIGS. 4A and 4B, the operational sequence in the loop characteristics detecting mode in the first embodiment will be explained. FIG. 4A is a flow chart of the loop characteristics detecting process. FIG. 4B shows a time chart of the loop characteristics detecting process and the corresponding frequency characteristics of voltage locked oscillator (VCO) 201.

Firstly, synthesizer 207 is set in a locked state (401). Next, after VCO 201 is pre-charged, the offset PLL is set in a locked state (frequency f1) at time=t1. Then, both switch 216 corresponding to the second input (IN2) of phase detector 203 and switch 221 corresponding to the first input (IN1) of phase detector 203 are set to the detecting mode for detecting loop characteristics.

Under this condition (t2), the value at terminal A in waveform 306 of FIG. 3 is measured (403) and stored in the register (t3). Next (t4), a step signal (frequency f2) is input from sigma delta modulator 232 (404). The step response is measured at terminal B of waveform 307 in FIG. 3 (405). Then, (t5), the difference (B−A) from the value at terminal A of waveform 306, is calculated (406). Controller 220 calculates the value of the charge pump current, performs feedback on the value of charge pump 204 (407), controls band-width around the transmitting frequency ftx, and sets the offset PLL to a locked state (t6). Thus, the calibration for detecting loop characteristics is complete for moving to the normal communication mode (t7).

Figure 5:
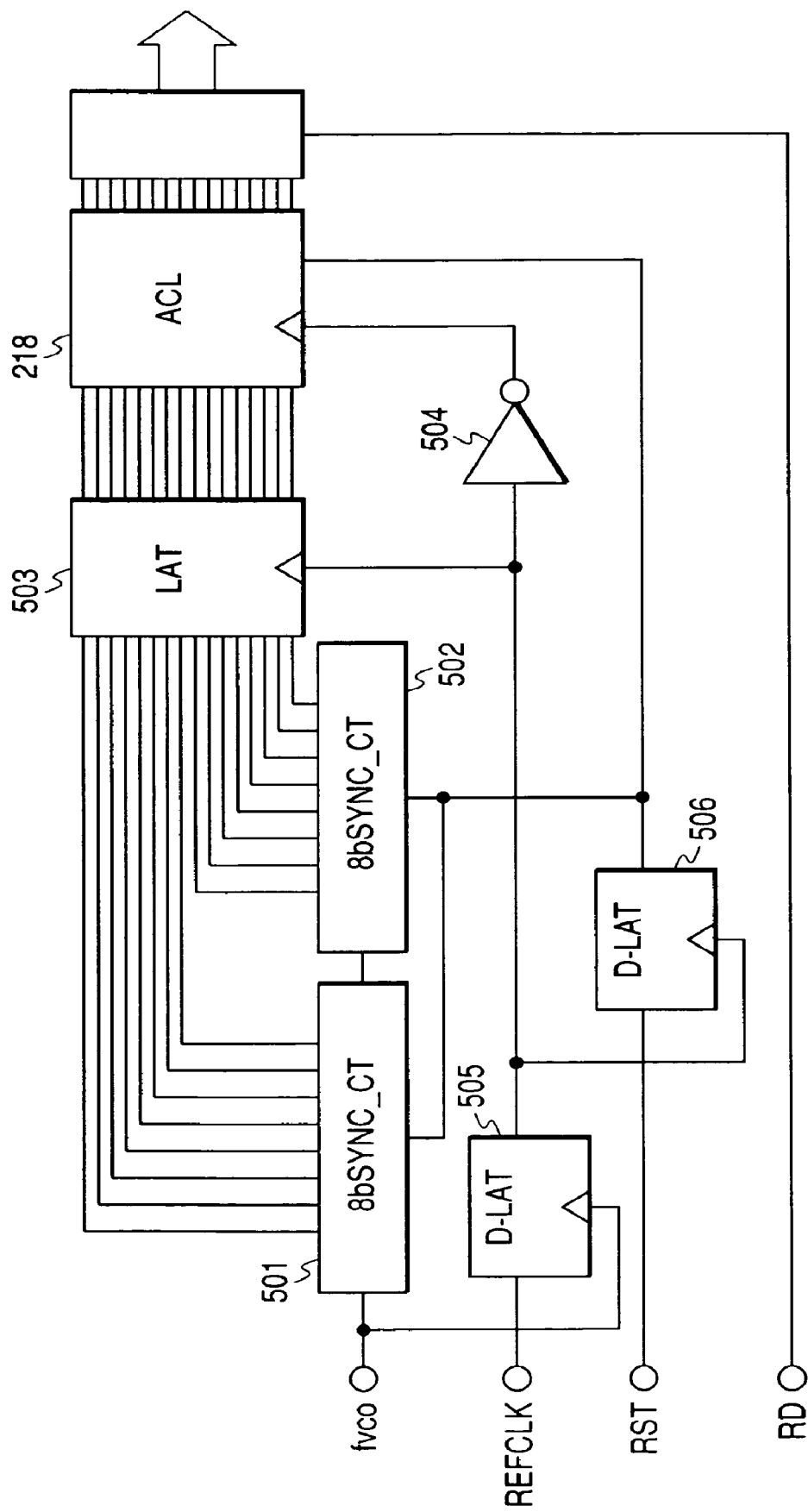
FIG. 5 is a diagram illustrating the configuration of the counter circuit and accumulator circuit according to the first embodiment.

Next, by using FIG. 5, the configuration of counter circuit 217 and accumulator circuit 218 according to the present embodiment will be explained in detail. Counter circuit 217 is composed of 8-bit synchronization counter (8 bSYNC_CT) 501 driven by the VCO signal (fVCO) and 8-bit synchronization counter (8 bSYNC_CT) 502 driven by the output of the counter. The progress of the count is taken into latch (LAT) 503 in a cycle of the standard clock REFCLK, with the inversed clock by inverter 504 being taken into accumulator (ACL) circuit 218. In order to prevent the collision of the in-take timing of latch 503 and the count timing of VCO 201, before driving latch 503, the timing is set to coincide with the standard clock by hitting D-latch circuit (D-LAT) 505 with the VCO signal. Counting starts by releasing the reset signal (RST); however, in order to prevent the collision of the standard clock and VCO signal, the timing is set to coincide with the standard clock by also hitting D-latch circuit 506 again with the VCO signal. The data-read signal (RD) makes, for example, latch circuit 503 active at the High state and output, the output of accumulator 218 at the comparative operation part.

Figure 6:
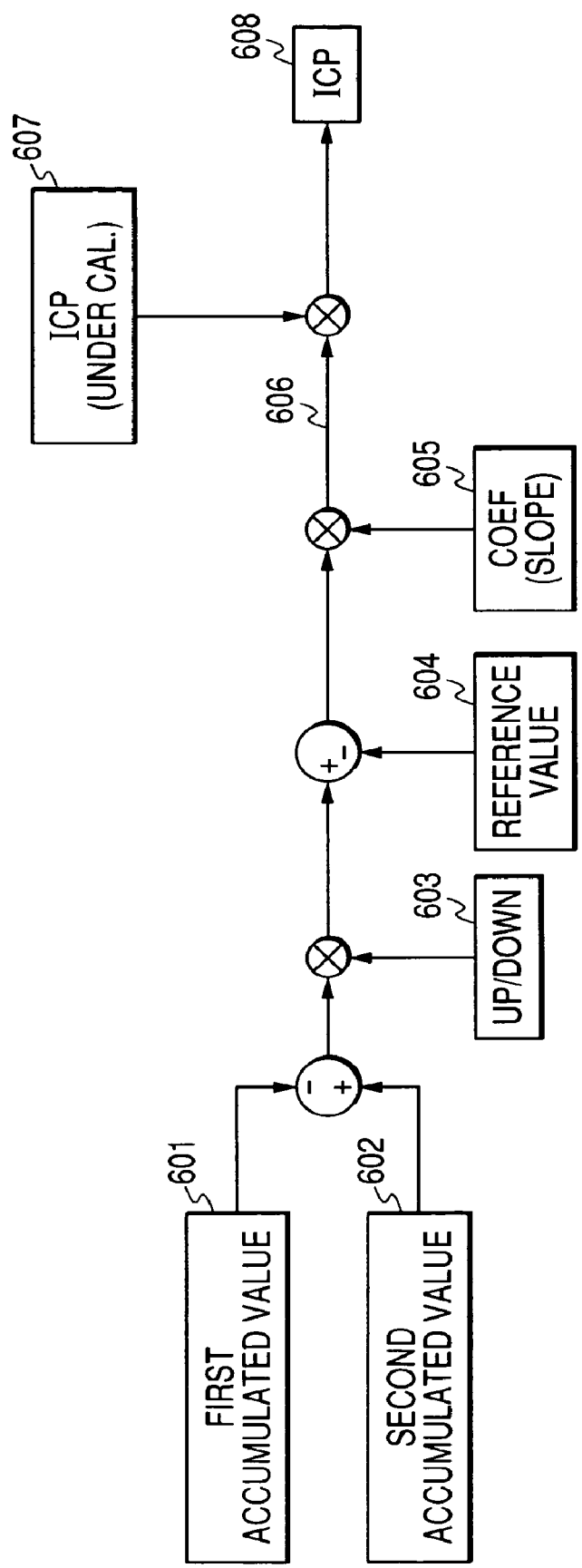
FIG. 6 is a diagram showing the configuration of the controller of the charge pump according to the first embodiment.

Next, by using FIG. 6, the configuration and operation of controller 220 in FIG. 2 will be illustrated in detail. In controller 220, the calculation is performed by utilizing the fact that the difference (B−A) between terminal B of waveform 307 and terminal A of waveform 306, shown in FIG. 3, varies almost in a proportional relationship with the reciprocal of the loop gain (1/Loop-gain). The result of the integration (601) at terminal A of waveform 306 is subtracted from the result of the integration (602) at terminal B of waveform 307 (B−A) to change the polarity, depending on whether the step signal for detection is a step-up or step-down signal. From this result, standard value 604 is subtracted, which corresponds to the loop band-width to be set, and coefficient 605 is multiplied. Since standard value 604 and coefficient 605 depend on the output frequency of the phase locked loop, a register is prepared so that the values can be changed according to the output frequency. Result 606 of the calculation is a value denoting what ratio shows the optimal loop gain against the loop gain at the detection when changing the loop gain. By multiplying result 606 of the calculation with value 607 of the charge pump current employed at the detection, value (Icp) 608 of the charge pump current for the optimal loop band-width is determined.

Figure 7:
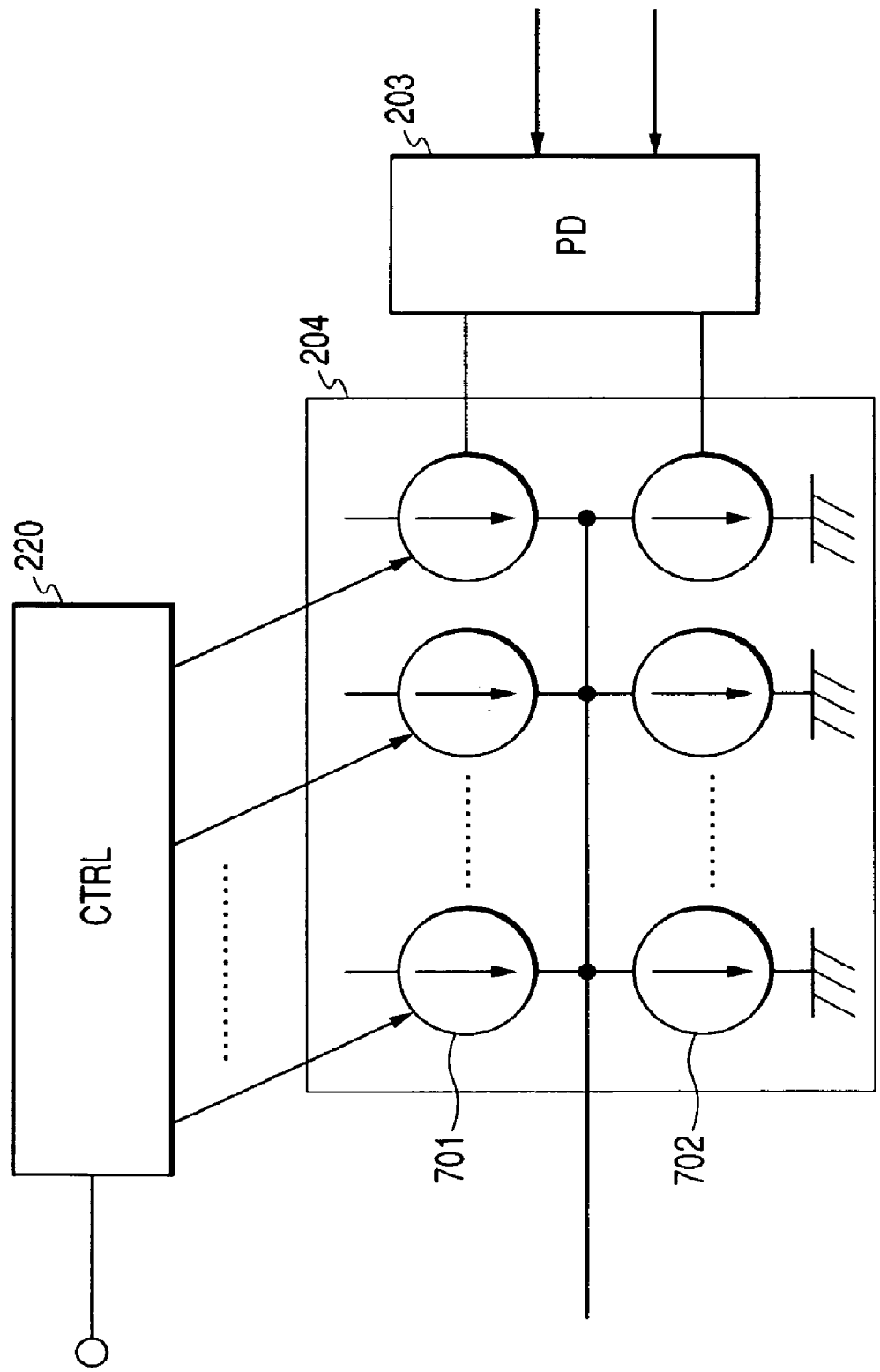
FIG. 7 is a drawing showing an example of the configuration of the charge pump according to the first embodiment of the present invention.

FIG. 7 is a diagram illustrating a concrete example of the variable-current type charge pump (CP) of FIG. 2. Charge current sources 701 are connected in parallel and the value of the charge current is determined by how many sources are operated. In addition, discharge current sources 702 are connected in parallel in the same fashion, the value of the discharge current also being determined by how many current sources are being operated. How many of these current sources are being operated is determined by the value of charge pump current (Icp) 608.

Figure 8:
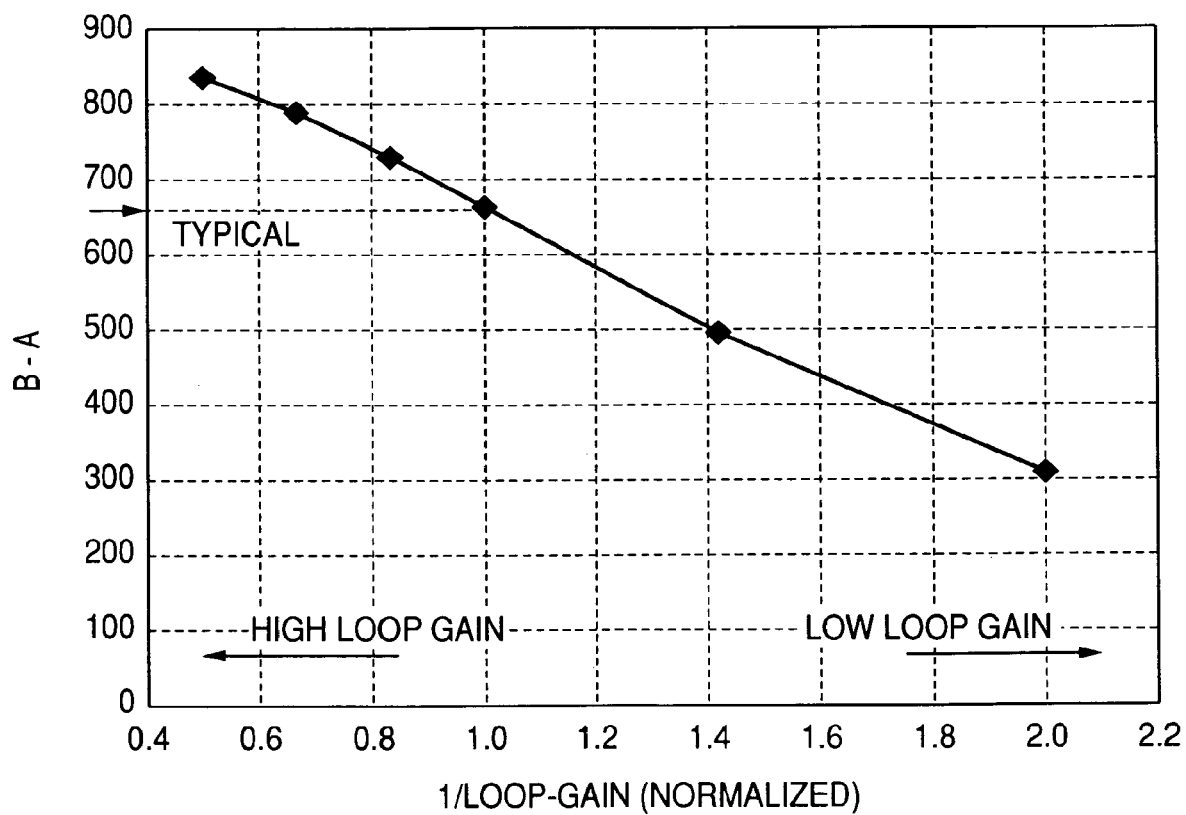
FIG. 8 is a drawing showing the result of the simulation according to the first embodiment of the present invention.

FIG. 8 shows the result of the simulation of loop characteristic detection based on the embodiment of FIG. 2. The longitudinal axis is value B−A, the horizontal axis being the reciprocal of the loop gain, and values are standardized according to the design value. In the figure, the optimal value is when the reciprocal of the loop gain is 1.0. From this figure, it is found that value B−A runs almost linear to the reciprocal of the loop gain.

Here, in order to compensate for the delay caused in the process of generating the transmitting signal (fREF1) from the first reference signal, that is, I/Q modulator 206, at the loop characteristics detecting mode, the effect of the control to step from a fractional value to a fractional value will be described in FIG. 9 (FIGS. 9A and 9B) and FIG. 10 (FIGS. 10A and 10B), as a result of the simulation when a delay is caused in the offset PLL.

Figure 9A:
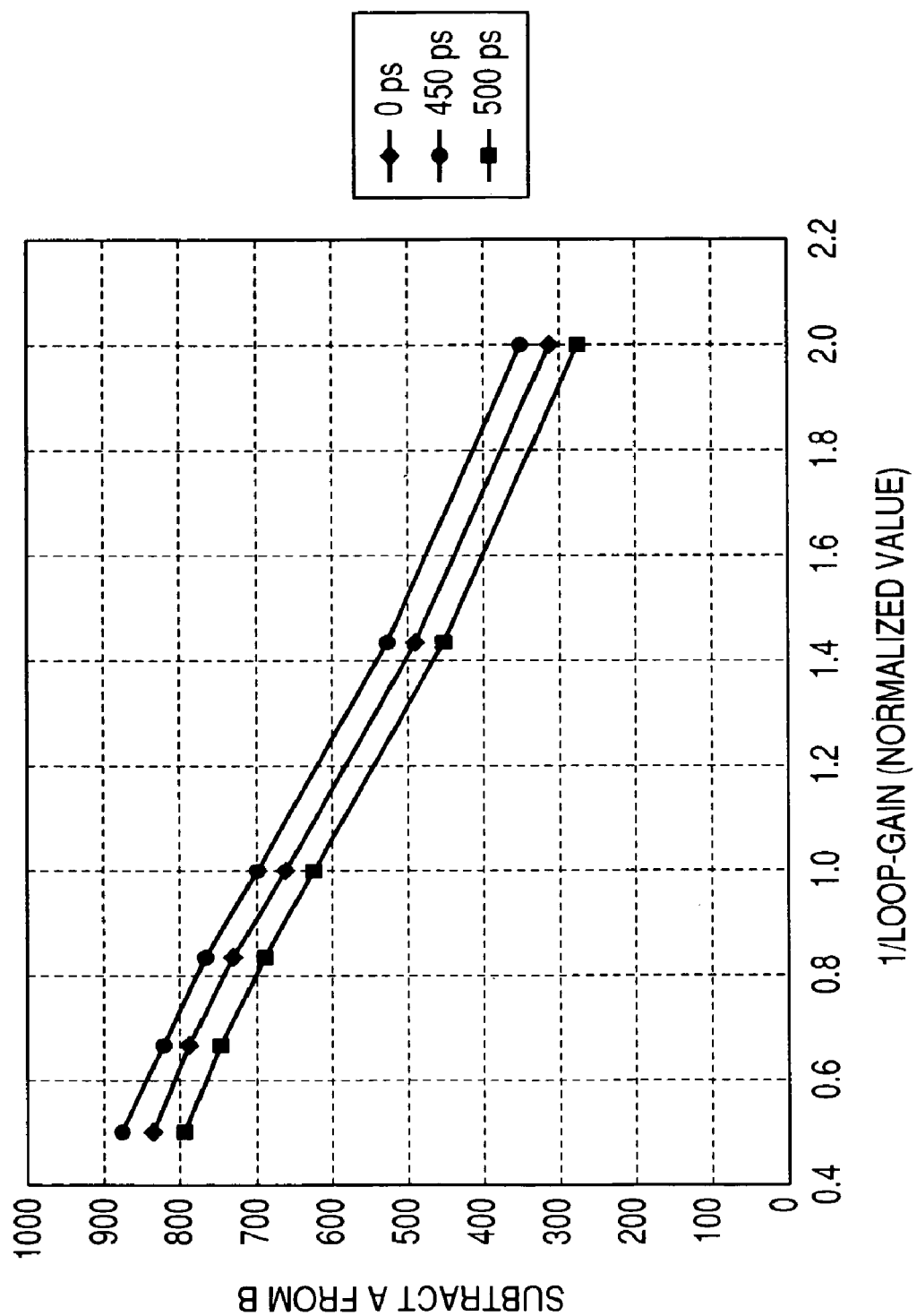
FIG. 9A is a diagram showing an example of a comparison for illustrating the sensitivity to the delay according to the first embodiment of the present invention to show the relation between the reciprocal of the loop gain and the value B−A.

Firstly, FIGS. 9A and 9B are examples for comparison. They are examples of when divider 211 for generating the step signal steps from an integer to a fractional value as the condition of simulation. FIG. 9A shows the relation between the reciprocal of the loop gain and value B−A and FIG. 9B shows the relation between the reciprocal of the loop gain and the detectable accuracy of the loop gain. Of each three characteristic curves of FIGS. 9A and 9B, the characteristic curve with diamond-shaped points in the center has no delay, the characteristic curve with circles has a delay of 450 Ps, and the characteristic curve with squares has a delay of 500 Ps. As is evident from FIG. 9B, it is sensitive to the delay, and the accuracy detectable the loop band-width is sometimes ±20% or more.

Figure 10A:
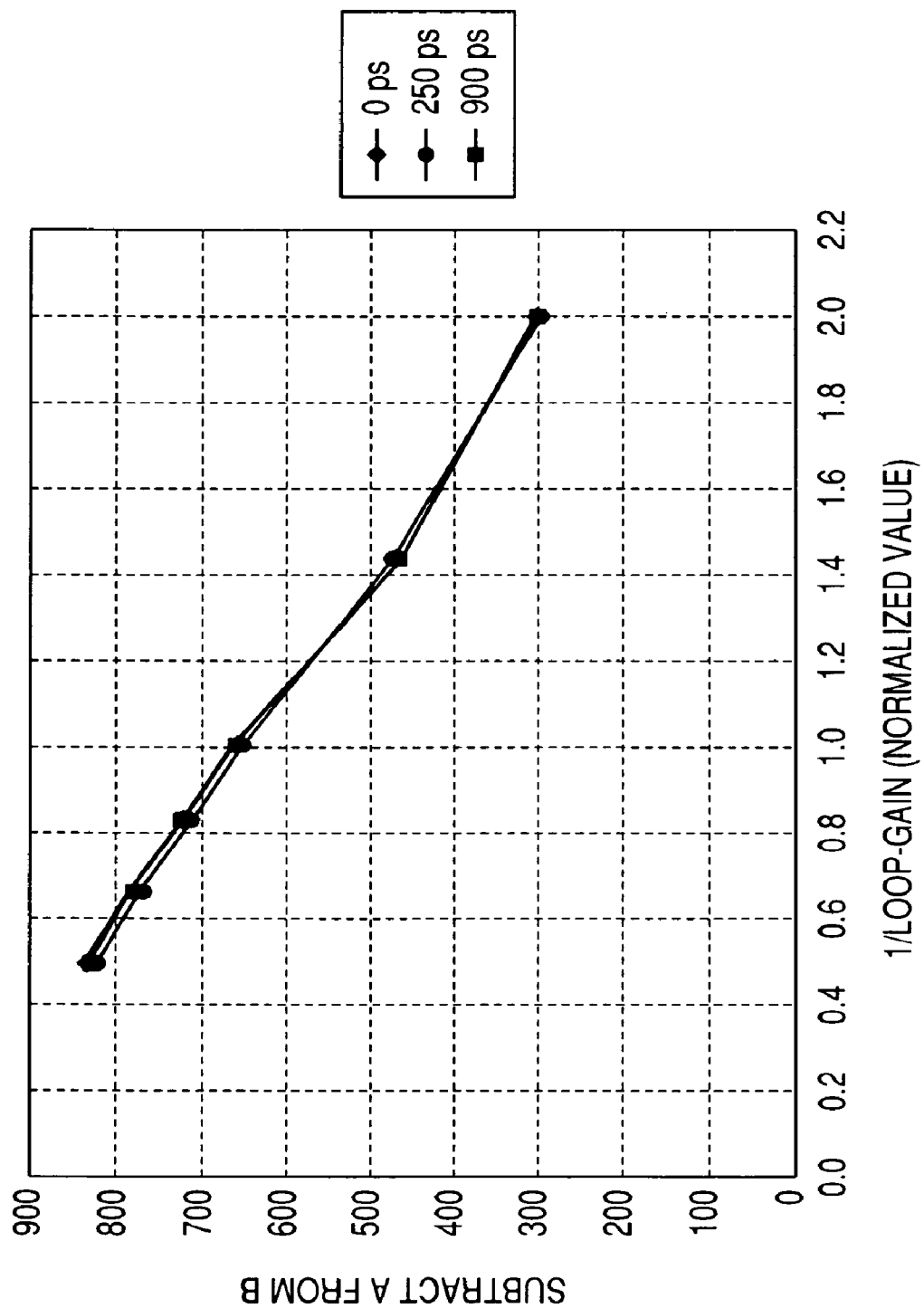
FIG. 10A is a diagram showing the relation between the reciprocal of the loop gain and the value B–A for illustrating the sensitivity to the delay according to the embodiment of the present invention.
Figure 10B:
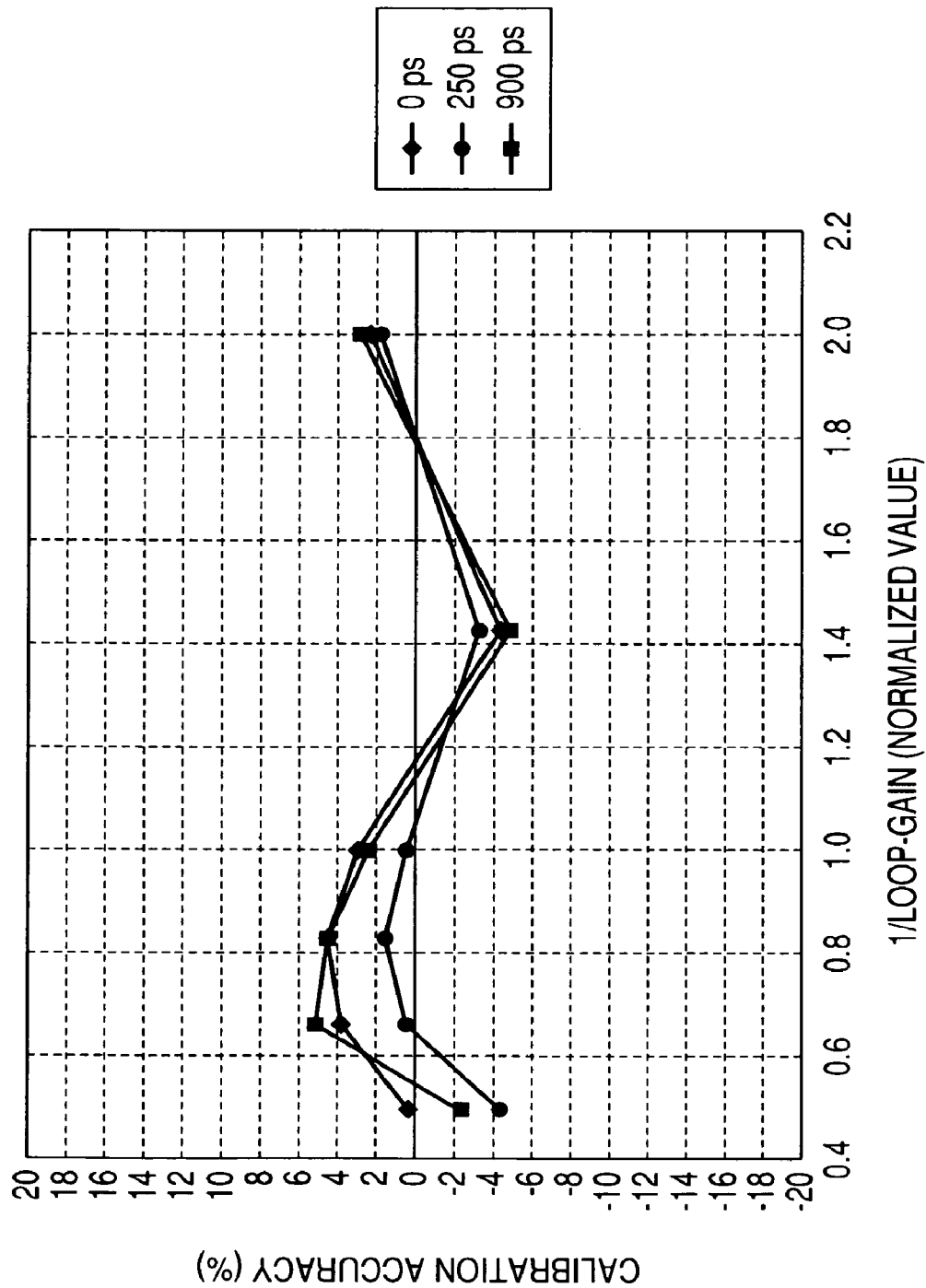
FIG. 10B is a diagram showing the relation between the reciprocal of the loop gain and the accuracy, with which the loop band-width can be detected, corresponding to FIG. 10A.

Next, FIGS. 10A and 10B correspond to the embodiment of the present invention, being examples of when, as a condition of the simulation, divider 211 steps from a fractional value to a fractional value. FIG. 10A shows the relation between the reciprocal of the loop gain and value B−A and FIG. 10B shows the relation between the reciprocal of the loop gain and the accuracy detectable in the loop band-width. In this case, it is possible to cancel the sensitivity of the delay, because, in the clocks for integration of voltage controlled signal source 201 and the output of divider 219, measurements 403 and 404 can be performed with the same initial phase.

Of each three characteristic curves of FIGS. 10A and 10B, the characteristic curve with diamond-shaped points in the center has no delay, the characteristic curve with circles has a delay of 450 Ps, and the characteristic curve with squares has a delay of 500 Ps. As is shown in FIG. 10B, the accuracy detectable in the loop band-width is ±6% or less, making it possible to greatly improve accuracy when compared with the case of FIG. 9B.

Thus, according to the present embodiment, the charge pump current can be changed depending on the result of the measurement of the loop gain of the PLL circuit; therefore, it is possible to provide a calibration system that can set an optimal loop band-with in a short time with high precision. Especially by using a sigma delta modulator is it possible to easily generate a small frequency step signal suitable for detecting loop characteristics.

Further, according to the present embodiment, since, by providing a loop gain detecting circuit the charge pump current can be changed in accordance with the result of the measurement of the loop gain of the PLL circuit, the variation of the characteristics of elements, temperature, and aging can be cancelled to always maintain an optimal loop band-width. Further, an automatic detection in a short time is possible to save labor. Furthermore, all the detection circuit according to the present invention can be configured by the digital circuit and it is possible to achieve high integration and low power dissipation. Moreover, the delay that is caused in the process of generating the first reference signal, that is, the transmitting signal (fREF1) from I/Q modulator 206, can be compensated for.

First Modification

In FIG. 3, the explanations are given on the assumption that the integration time by integrator 218 in the phase locked loop circuit of FIG. 1, that is, time T1 from the integration value zero to terminal B in waveform 307 is equal to time T2 from the integration value zero to terminal A in waveform 306. However, as a modified example of the first embodiment, it is possible to improve the proportional relation between the difference value (B−A) and the reciprocal (1/Loop-gain) of the loop gain by optimizing the relation between integration times T1 and T2.

Second Modification

Integrator 218 in the phase locked loop circuit in the first embodiment is composed of a single stage; however, it is allowable to configure it so that multistage integrators be connected instead and the difference value (B−A) obtained in the preceding integrator is synchronized by the subsequent integrator to further perform integration. Through these configurations, the characteristics of the proportional relation between the difference value (B−A) and the reciprocal (1/Loop-gain) of the loop gain is further improved to enhance the accuracy of detecting loop characteristics.

In addition, as for the means to compensate for the delay caused in the process of generating the first reference signal, in the first embodiment, sigma delta modulator 232 generates the step signal whose division number of divider 211 is changed in the phase locked loop circuit; however, the configuration is not limited thereto.

Second Embodiment

Next, using FIG. 11, explanations will be given for the entire configuration and operation of the offset PLL-type phase locked loop circuit and offset PLL transmitter, including the above, according to the second embodiment of the present. In the previously mentioned first embodiment, regarding the clock for sampling the count number of counter 217, the frequency-divided signal of the output of down conversion mixer 202 into two by the divider is employed. The clock employed for sampling by integrator 218 is not limited to this.

In the second embodiment, as for the clock of integrator 218, a signal is employed that is obtained by frequency-dividing the output of divider 208 further into eight by divider 1001. In this case, in order to set the timing to input the step signal and the delay of divider 208 to always have the same relation, it is necessary to set initial values for dividers 208 and 1001.

According to the present embodiment, the charge pump current can be variable depending on the result of the measurement of the loop gain of the PLL circuit; therefore, it is possible to provide a calibration system that can set an optimal loop band-with in a short time with high precision.

Third Embodiment

Figure 12:
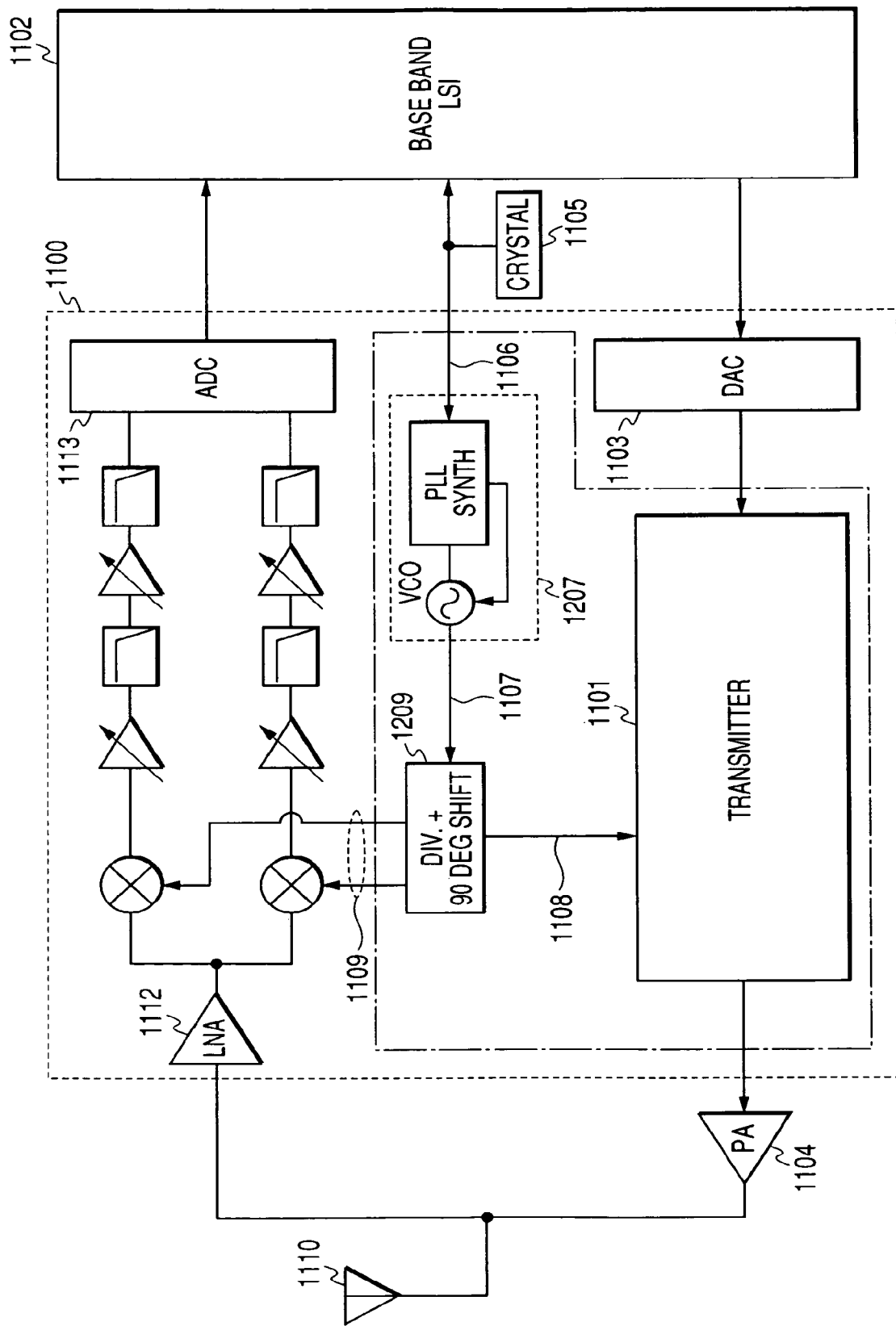
FIG. 12 is a diagram showing the configuration of the phase locked loop circuit and multi-band method mobile communication system.

Next, explanations will be given to the third embodiment of the present invention. FIG. 12 illustrates the case wherein the phase locked loop circuit, described in FIG. 2, etc., is applied to the radio frequency LSI comprising the multi-band method mobile communication system (mobile phone). The communication system of FIG. 12 is composed of radio frequency integrated circuit 1100, LSI part 1102 for performing the base band signal processing, power amplifier (PA) 1104, antenna 1110, and crystal 1105 for generating the reference signal.

Radio frequency integrated circuit 1100 is provided with Transmitter 1101, DA converter 1103, which performs DA conversion of the signal generated at LSI 1102, to send it to Transmitter 1101, synthesizer block 1207, and 90-degree shifter 1209.

Also, as a Receiver, Low-noise Amplifier (LNA) 1112 for amplifying the received signal, a modulation circuit for modulating the received signal, AD converter 113 for performing the AD conversion of the modulated signal to output to the base band LSI, etc., are provided.

Figure 11:
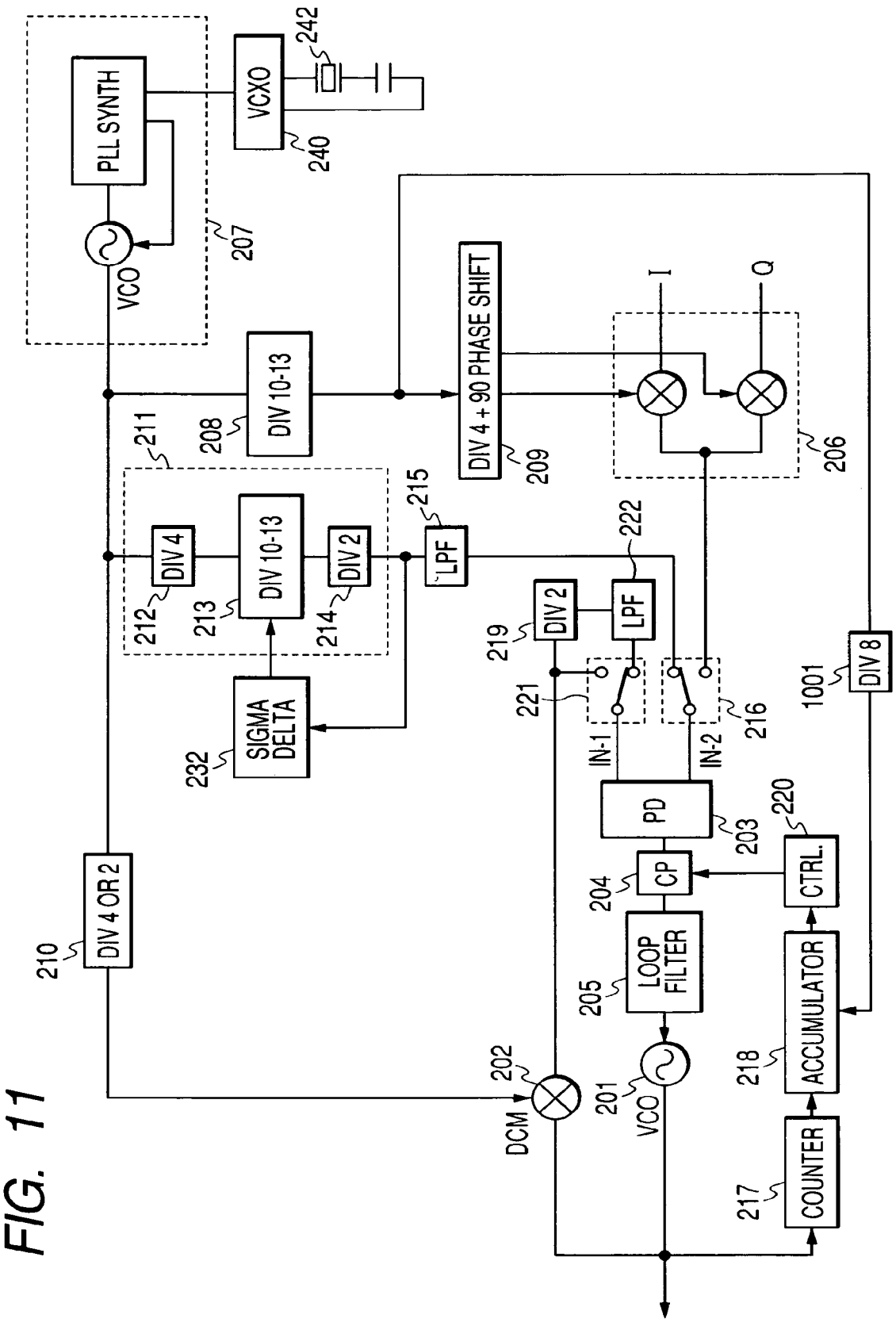
FIG. 11 is a diagram showing the entire configuration of the offset PLL phase locked loop circuit and the PLL transmitter according to the second embodiment of the present invention.

In addition, Transmitter 1101, synthesizer block 1207, and 90-degree shifter 1209, which are the area surrounded by the chain double-dashed line in FIG. 12, correspond to the offset PLL transmitter in FIGS. 2 and 11. Unlike the previously mentioned embodiment, synthesizer block 1207 and 90-degree shifter 1209 are involved not only in the Transmitter but also in the generation of the local signal of the Receiver.

In the present embodiment, for the area surrounded by the chain double-dashed line like synthesizer block 1207, such circuits are employed as those having configurations shown in FIGS. 2 and 11, and the loop band-width is calibrated by optimizing the charge pump current.

Upon calibration of the loop band-width, firstly, signal 1106 is subjected to the step change, which is from crystal 1105, which supplies the reference signal to synthesizer 1207. The stepped signal is input into the reference signal side of the phase detector of synthesizer 1207. The step signal is detected by using the counter and integrator in output signal 1107 of the synthesizer.

Thus, synthesizer block 1207 can always be set at an optimal loop band-width to stably provide local signal 1108 for transmitting and local signal 1109 for receiving. By using this embodiment, it is possible to maintain the noise level of the local signal at a certain level during transmission and reception.

The mobile communication system according to the present embodiment can shorten the time needed to calibrate the loop band-width by adopting an offset PLL transmitter having a calibration system of the loop band-width for synthesizer 1207. Especially by employing the sigma delta modulator for generating the step signal in the offset PLL, it is easy to generate a small frequency step signal suitable for detecting the loop characteristics.

According to the present embodiment, it is possible to configure a calibration circuit comprising all the counter and integrator necessary for detecting the step response with the digital circuit. In addition, the analog characteristics of the PLL circuit depend on the error feedback quantity, sensitivity in controlling the oscillator, characteristics of the loop filter, etc.; however, the calibration circuit according to the present embodiment can collectively calibrate all of the variation in performance with high precision. Thus, the entire loop filter circuit is integrated into the PLL circuit to realize the downsizing and high performance of the radio frequency analog LSI. Also, radio frequency integrated circuit 1101 can be realized, which is equipped with synthesizer block 207, having a calibration system of the loop band-width. Further, a phase locked loop circuit can be realized that has low phase noise and that is not easily by the load variation.

Since the present invention employs a method in which the signal for detecting the loop band-width is directly input to the input side of the reference signal of the phase detector, it can be applied to various methods of PLLs, represented by the offset PLL transmitter.

Fourth Embodiment

Figure 13:
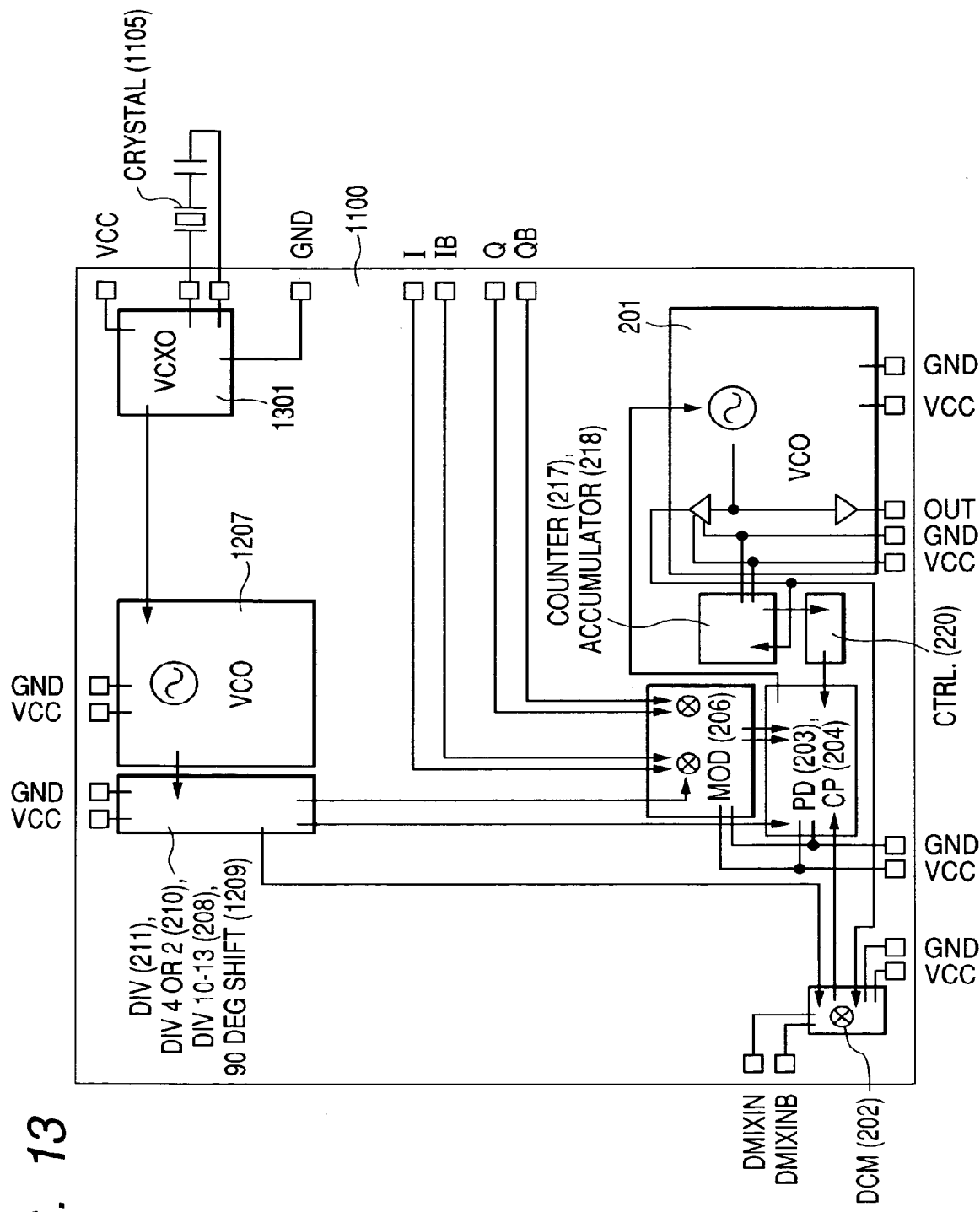
FIG. 13 is a diagram showing an example of the layout when the radio frequency integrated circuit of FIG. 12 is configured as an integrated circuit chip.

Next, by using FIG. 13, explanations will be given for the fourth embodiment of the present invention. FIG. 13 shows an example of the layout in the case that radio frequency integrated circuit 1100 in FIG. 12 is configured as semiconductor integrated circuit chip 1300. Semiconductor integrated circuit chip 1300 is a chip whose planar shape is practically a rectangle, more preferably a square. In integrated circuit chip 1300 of FIG. 13, Transmitter 1101, synthesizer block 1207, and 90-degree shifter 1209 are shown, which are surrounded by the chain double-dashed line in FIG. 12, other parts being abbreviated.

Firstly, counter 217, accumulator 218, and controller 220 for calibration are placed between oscillator (VCO) 201 and down conversion mixer (DCM) 202 in Transmitter 1101. Then, oscillator 201 is located at the corner (the first corner) of the integrated circuit chip to avoid the affect of the coupling of the circumference, and down version mixer 202 is located at the other corner (the second corner) of the integrated circuit chip, for example, at the other corner of the same side, to avoid the coupling from oscillator 201. Counter 217, accumulator 218, and controller 220 are digital elements that perform discrete operation; therefore, it is difficult for them to be subjected to the coupling of the analog factor from oscillator 201. Accordingly, it is preferable that counter 217, accumulator 218, and controller 220 are located between oscillator 201 and down conversion mixer 202. Then, for example, in the vicinity of the lower side of the rectangle, phase detector 203, charge pump 204, I/Q modulator 206, and switches (216, 221) are placed between these digital elements (counter 217, accumulator 218, and controller 220) and down conversion mixer 202. Thus, without preparing any special guard around oscillator 201, low noise in the transmitter can be realized. In addition, since no guard is necessary, chip area can be reduced.

Next, synthesizer (oscillator) 1207 for generating the local signal is placed away from oscillator 201, to avoid interference with oscillator 201. For example, as shown in the figure, when the first and second corners are placed on both sides of the lower side of the rectangle, oscillator 1207 is placed on the side that does not include the first and second corners, that is, in the vicinity of the upper side of the rectangle. Divider 208, the ¼ frequency divider, the 90-degree phase shifter, divider 211, 90-degree shifter 1209, etc., are located in the vicinity of synthesizer 1207. In addition, it is preferable to locate synthesizer 1207 as close to I/Q modulator 206 and down conversion mixer 202 as possible. That is, it is preferable to locate them between synthesizer 1207 and the midway part of the upper side of the rectangle, or a little to the left of that. Through the above, it is possible to reduce the affect of the jitter and coupling in the wiring, so as to suppress the noise in the local signal.

Further, voltage controlled crystal oscillator (VCXO) 1301 generates the reference signal in the chip in tune with external crystal (crystal oscillator) 1105 and plays a role in calibrating the frequency error of the voltage control. Especially, in order to generate the reference signal of synthesizer 1207 and the clock signal in LSI 1102 of FIG. 12, voltage controlled crystal oscillator 1301 should sufficiently take the influence of the noise and coupling into consideration. Therefore, it is preferable that voltage controlled crystal oscillator 1301 be located at the corner of the chip apart from the first and second corners—for example, at the corner (the third corner) on the upper side of the rectangle—thus, it is possible to reduce the jitter noise of the clock signal in the logic and to suppress the phase noise in oscillator 207.

In addition, the other components of radio frequency integrated circuit 1100 are suitably located according to the above-mentioned layout in the remaining area of integrated circuit chip 1300.

According to the present embodiment, it is possible to set the loop band-width in various types of phase locked loops by a simple configuration with high accuracy and to integrate it into the PLL circuit to enhance high integration and low power dissipation, and, at the same time, to provide a radio frequency integrated circuit for the mobile phone system, which is low-noise and can reduce chip area.

What is claimed is:

1. A multi-band type semiconductor circuit device which adjusts a plurality of frequency bandwidths, comprising:
   a base band;
   a transmitter circuit;
   a receiver circuit; and
   a synthesizer block changing a division ratio,
   wherein an output signal of said receiver circuit is inputted to said base band,
   wherein an output signal of said base band is inputted to said transmitter circuit, and the output signal of said base band is modulated to a first reference signal by an I/Q modulator of said transmitter circuit,
   wherein said synthesizer block supplies a signal as a local clock, and varies a frequency of an input clock signal from a crystal oscillator to said transmitter circuit and said receiver circuit,
   wherein said transmitter circuit includes an offset PLL transmitter, and
   wherein said offset PLL transmitter comprises
      a first voltage locked oscillator;
      a first frequency conversion circuit, with which an output of said first voltage locked oscillator is connected;

a first phase detector, having a first input at a first input side with which an output of said first frequency conversion circuit is connected and a second input selectively connected to a first reference signal or an output signal of a first signal source;

a first charge pump circuit, with which an output of said first phase detector is connected;

a first loop filter, with which an output of said first charge pump circuit is connected;

a first counter which is connected with an output of said first voltage locked oscillator;

a first integrator, which is connected with an output of said first counter; and a controller, which detects loop characteristics of said offset PLL transmitter based on a result of detection of said first integrator and which performs feedback of the result of detection on a value of the charge pump current, wherein said local clock is inputted to said first frequency conversion circuit of said transmitter circuit, and wherein said loop characteristics is detected by varying the frequency of said output signal of said first signal source.

2. The semiconductor circuit device according to claim 1, wherein said output signal of said first signal source configures said frequency at a fractional frequency.

3. The semiconductor circuit device according to claim 1, wherein said first signal source includes a first sigma delta modulator.

4. The semiconductor circuit device according to claim 1, further comprising:

a first switch which is established at said first input side of said first phase detector; and a second switch provided at said second input side, wherein said first switch is configured, based on operating conditions of said offset PLL transmitter, to switch said first input to one of a first path, which is directly connected with the output of said first circuit for frequency conversion, and a second path, with which the output of said first circuit for frequency conversion is connected via a divider, and wherein said second switch is configured, based on the operating conditions of said offset PLL transmitter, to switch said second input to one of said first reference signal and said first signal source.

5. The semiconductor circuit device according to claim 1, wherein said first integrator is configured by integrators of a plurality of stages.

6. The semiconductor circuit device according to claim 1, wherein an input signal of the first input side of said first phase detector is used as a clock for said first integration circuit.

7. A semiconductor circuit device comprising:

a base band;

a transmitter circuit; a receiver circuit; and a synthesizer block, wherein an output signal of said receiver circuit is inputted to said base band, wherein an output signal of said base band is inputted to said transmitter circuit, and the output signal of said base band is modulated to a first reference signal by an I/Q modulator of said transmitter circuit, wherein said synthesizer block generates a local clock from an input clock signal from a crystal oscillator, and supplies said local clock to said transmitter circuit and said receiver circuit, wherein said transmitter circuit includes an offset PLL transmitter, and wherein said offset PLL transmitter comprises a first voltage locked oscillator;

a first frequency conversion circuit, with which an output of said first voltage locked oscillator is connected;

a first phase detector, having a first input at a first input side with which an output of said first frequency conversion circuit is connected and a second input selectively connected to a first reference signal or an output signal of a first signal source;

a first charge pump circuit, with which an output of said first phase detector is connected;

a first loop filter, with which an output of said first charge pump circuit is connected;

a first counter, which is connected with an output of said first voltage locked oscillator;

a first integrator, which is connected with an output of said first counter; and a controller, which detects loop characteristics of said offset PLL transmitter based on a result of detection of said first integrator and which performs feedback of the result of detection to control a value of the charge pump current, wherein said local clock is inputted to said first frequency conversion circuit of said transmitter circuit, and wherein said loop characteristics are detected by varying the frequency of said output signal of said first signal source.

8. The semiconductor circuit device according to claim 7, wherein said output signal of said first signal source configures said frequency at a fractional frequency.

9. The semiconductor circuit device according to claim 7, wherein said first signal source includes a first sigma delta modulator.

10. The semiconductor circuit device according to claim 7, further comprising:

a first switch provided at said first input side of said first phase detector; and a second switch provided at said second input side, wherein said first switch is configured, based on operating conditions of said offset PLL, to switch said first input to one of a first path, which is directly connected with the output of said first circuit for frequency conversion, and a second path, with which the output of said first circuit for frequency conversion is connected via a divider, and wherein said second switch is configured, based on the operating conditions of said offset PLL, to switch said second input to one of said first reference signal and said first signal source.

11. The semiconductor circuit device according to claim 7, wherein said first integrator is configured by integrators of a plurality of stages.

12. The semiconductor circuit device according to claim 7, wherein an input signal of the first input side of said first phase detector is used as a clock for said first integration circuit.

* * * * *